(12) United States Patent
Choi et al.

(10) Patent No.: US 10,665,752 B2
(45) Date of Patent: May 26, 2020

(54) AIR VOID STRUCTURES FOR SEMICONDUCTOR FABRICATION

(71) Applicant: Saphlux, Inc., Branford, CT (US)

(72) Inventors: Joo Won Choi, Woodbridge, CT (US); Chen Chen, New Haven, CT (US); Jie Song, New Haven, CT (US)

(73) Assignee: Saphlux, Inc., Branford, CT (US)

(*) Notice: Subject to any disclaimer, the term of this patent is extended or adjusted under 35 U.S.C. 154(b) by 0 days.

(21) Appl. No.: 15/844,344

(22) Filed: Dec. 15, 2017

(65) Prior Publication Data
US 2019/0189849 A1     Jun. 20, 2019

(51) Int. Cl.
| | | |
|---|---|---|
| H01L 33/32 | (2010.01) | |
| H01L 33/08 | (2010.01) | |
| C30B 29/40 | (2006.01) | |
| H01L 33/24 | (2010.01) | |
| H01L 21/02 | (2006.01) | |
| H01L 29/20 | (2006.01) | |
| H01L 27/15 | (2006.01) | |
| C30B 25/18 | (2006.01) | |

(52) U.S. Cl.
CPC .......... *H01L 33/325* (2013.01); *C30B 25/18* (2013.01); *C30B 29/406* (2013.01); *H01L 21/0254* (2013.01); *H01L 21/0262* (2013.01); *H01L 21/02458* (2013.01); *H01L 21/02491* (2013.01); *H01L 21/02513* (2013.01); *H01L 21/02658* (2013.01); *H01L 27/153* (2013.01); *H01L 29/2003* (2013.01); *H01L 33/08* (2013.01); *H01L 33/24* (2013.01); *H01L 21/0242* (2013.01)

(58) Field of Classification Search
CPC ....... H01L 33/325; H01L 33/08; H01L 33/24; H01L 21/02491; H01L 27/153; H01L 29/2003; C30B 29/406
USPC .......................................................... 257/88
See application file for complete search history.

(56) References Cited

U.S. PATENT DOCUMENTS

| | | | |
|---|---|---|---|
| 7,638,414 | B2 | 12/2009 | Choi et al. |
| 8,212,268 | B2 | 7/2012 | Konno |
| 8,946,753 | B2 | 2/2015 | Zhu et al. |
| 9,153,944 | B2 | 10/2015 | Lee et al. |
| 9,514,926 | B2 | 12/2016 | Hong et al. |
| 2008/0217647 | A1 | 9/2008 | Choi et al. |
| 2009/0283782 | A1 | 11/2009 | Shakuda |
| 2011/0057214 | A1 | 3/2011 | Konno |
| 2011/0155061 | A1* | 6/2011 | Chen ............... C23C 16/301 118/725 |
| 2014/0332833 | A1* | 11/2014 | Kim ............... H01L 21/02381 257/97 |

(Continued)

*Primary Examiner* — Tong-Ho Kim

(57) ABSTRACT

Aspects of the disclosure provide for mechanisms for forming air voids for semiconductor fabrication. In accordance with some embodiments, a method for forming air voids may include forming a first semiconductor layer including a first group III material and a second group III material on a substrate; forming a plurality of air voids in the first semiconductor layer by removing at least a portion of the second group III material from the first semiconductor layer; and forming a second semiconductor layer on the first semiconductor layer. The second semiconductor layer may include an epitaxial layer of a group III-V material. In some embodiments, the first group III material and the second group III material may be gallium and indium, respectively.

19 Claims, 6 Drawing Sheets

(56) References Cited

U.S. PATENT DOCUMENTS

2015/0222094 A1 8/2015 Lee et al.
2015/0364319 A1* 12/2015 Park .................. H01L 21/02458
257/615

* cited by examiner

US 10,665,752 B2

AIR VOID STRUCTURES FOR SEMICONDUCTOR FABRICATION

CROSS-REFERENCE TO RELATED APPLICATIONS

The present application is related to U.S. patent application Ser. No. 15/843,758 entitled "Light Extraction Structures for Semiconductor Devices" filed on the same day as the present application, which is assigned to the assignee of the present application and is hereby incorporated by reference in its entirety.

TECHNICAL FIELD

The implementations of the disclosure generally relate to semiconductor fabrication and, more specifically, to forming air void structures for semiconductor fabrication.

BACKGROUND

Group III-V materials (e.g., AlN, GaN, and InN) are suitable materials for fabrication of a variety of semiconductor devices. For example, gallium nitride (GaN) and other III-nitride materials have relatively wide band gaps and can be used to make electro-optic devices (e.g., light-emitting diodes (LEDs), laser diodes (LDs), etc.) that emit radiation in the green and blue regions of the visible spectrum. Group III nitride materials can also be used to fabricate high-power electronics because they exhibit higher breakdown voltages when used for fabricating integrated transistors.

Because high-quality substrates of III-V materials may be difficult to obtain, a group III-V material may typically be heteroepitaxially grown on a foreign substrate of a different material. For example, GaN may be grown on a sapphire substrate. However, large lattice mismatches may exist between the foreign substrate and epitaxial layers of the III-V material and may lead to formation of threading dislocations. This may deteriorate the quality of the semiconductor devices formed using the III-V material.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

Mechanisms for forming air voids for semiconductor fabrication are provided. In accordance with some embodiments, a method for semiconductor fabrication is provided. The method may include forming a first semiconductor layer comprising a first group III material and a second group III material on a substrate; forming a plurality of air voids in the first semiconductor layer by removing at least a portion of the second group III material from the first semiconductor layer; and forming a second semiconductor layer on the first semiconductor layer. In some embodiments, the second semiconductor layer may include an epitaxial layer of a group III-V material.

In some embodiments, the first group III material may be gallium. In some embodiments, the second group III material may be indium.

In some embodiments, forming the first semiconductor layer may include initiating a process for epitaxial growth of the group III-V material.

In some embodiments, the process for epitaxial growth of the group III-V material may include a metal organic chemical vapor deposition (MOCVD) process.

In some embodiments, the process for epitaxial growth of the group III-V material may include a molecular beam epitaxy (MBE) process.

In some embodiments, forming the first semiconductor layer may further include adjusting a temperature in the processing chamber to a first temperature, and wherein forming the plurality of air voids in the first semiconductor layer may include adjusting the temperature in the processing chamber to a second temperature.

In some embodiments, the second temperature is higher than the first temperature.

In some embodiments, the first temperature is between 300° C. and 800° C.

In some embodiments, the second temperature is higher than 800° C.

In some embodiments, forming the first semiconductor layer may include: flowing a first precursor comprising the first group III material in a processing chamber; and flowing a second precursor comprising the second group III material in the processing chamber.

In some embodiments, the first precursor may include triethylgallium (TEGa).

In some embodiments, the second precursor may include trimethylindium (TMIn).

In some embodiments, removing at least the portion of the second group III material from the first semiconductor layer may include flowing a gas flow including hydrogen in the processing chamber.

In some embodiments, removing at least the portion of the second group III material from the first semiconductor layer may further include stopping flowing the second precursor in the processing chamber.

In some embodiments, forming the second semiconductor layer may further include growing an epitaxial layer of the group III-V material on the first semiconductor layer.

In some embodiments, the group III-V material may include the first group III material.

In some embodiments, the III-V material may be gallium nitride.

In some embodiments, the method may further include separating the second semiconductor layer from the substrate via the first semiconductor layer.

In accordance with some embodiments of the present disclosure, a semiconductor device is provided. The semiconductor device may include: a substrate; a first semiconductor layer comprising a plurality of air voids; and a second semiconductor layer. In some embodiments, the first semiconductor layer is positioned between the substrate and the second semiconductor layer.

In some embodiments, the first semiconductor layer may comprise a first epitaxial layer of a group III-V material. In some embodiments, the second semiconductor layer comprises a second epitaxial layer of the group III-V material.

In some embodiments, the first semiconductor layer may include a layer of a first group III material and a second group III material. The group III-V material may comprise the first group III material.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1A:
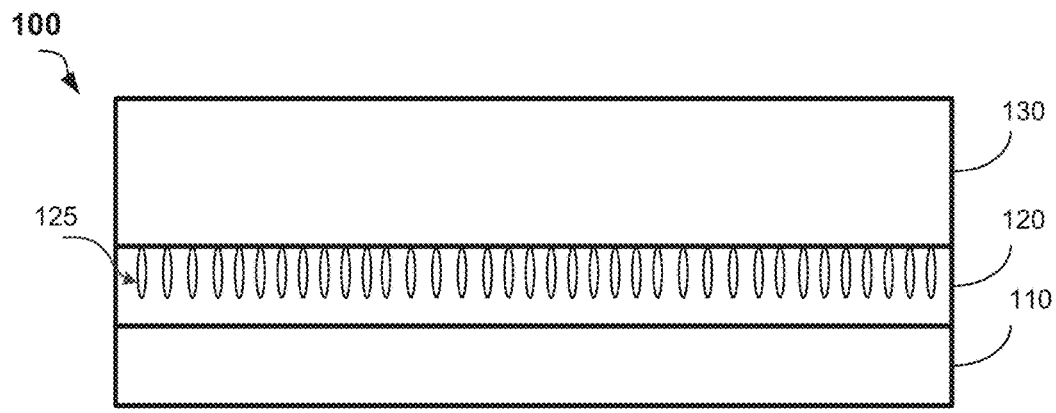
FIGS. 1A, 1B, and 1C are schematic diagrams illustrating a process for fabricating an example semiconductor device in accordance with some embodiments of the disclosure.

Aspects of the disclosure provide for mechanisms for forming air void structures for semiconductor fabrication. Prior solutions for providing air void structures during fabrication of semiconductor typically involve performing electrochemical etching to form air voids on an n-GaN (n-doped GaN) film. As such, the prior solutions utilize ex-situ processes to form the air voids and suffer from growth interruption and complicated procedures. The prior solutions for air voids formation may also be unstable, time-consuming, and cost inefficient and may result in handling issues such as dust and non-uniformity in the semiconductors produced thereon.

Aspects of the disclosure address the above deficiencies by providing mechanisms for forming air void structures during the growth of epitaxial layers of semiconductor materials. For example, a group III-V material, such as gallium nitride (GaN), may be grown on a substrate (e.g., a sapphire substrate) utilizing a metal organic chemical vapor deposition (MOCVD) process, a molecular beam epitaxy (MBE) process, or any other suitable process for epitaxial growth of III-V materials. The substrate may be cleaned (e.g., heated in a hydrogen ambient or any other suitable ambient) in a processing chamber (e.g., a MOCVD reactor). The temperature in the processing chamber may be adjusted to a first value (e.g., a temperature over 1000° C.) to facilitate the growth of the group III-V material. In some embodiments, precursors containing a group III material (e.g., gallium) and nitrogen may then be provided to the processing chamber to grow a group III-nitride material. The precursors may react at the surface of the heated substrate to form a group III-nitride layer (e.g., a gallium nitride layer) on the substrate.

During the growth of the group III-V material, the mechanisms may form a semiconductor layer with embedded air voids. For example, the mechanisms can control the temperature of the processing chamber to a second value (e.g., a temperature between 300° C. and 800° C.). The mechanisms can also flow precursors containing gallium and indium in the processing chamber to form a layer containing gallium and indium, such as an indium gallium nitride (InGaN) layer. Indium droplets may form on a surface of the InGaN layer in some embodiments. The mechanisms can adjust the temperature in the processing chamber to a third value and can flow hydrogen in the processing chamber. Additionally, the mechanisms can stop flowing the precursor(s) containing indium in the processing chamber. The third value may be and/or include, for example, a temperature that is higher than 800° C. The presence of hydrogen in the processing chamber may retard incorporation of indium into the InGaN layer and may result in no or low incorporation of indium into the InGaN layer. The presence of hydrogen may also remove the indium droplets from the surface of the InGaN layer. The removal of the indium from the InGaN layer may form air voids in the InGaN layer.

After the formation of the air voids, the mechanisms can adjust the temperature in the processing chamber to a fourth value to facilitate the growth of the III-V material. The fourth value may be a temperature that is higher than 900° C. in some embodiments. One or more epitaxial layers of the III-V material may then be formed.

Accordingly, the mechanisms provided in the present disclosure can enable the formation of air voids at any desired position in epitaxial layers of III-V materials during growth of the III-V materials. The mechanisms can form air voids of desired sizes, densities, dimensions, and/or any other attribute during epitaxial growth of group III-V materials by controlling growth conditions. For example, the mechanisms can form air voids of various sizes and densities by supplying various amounts of indium and/or hydrogen gas.

The mechanisms of the present disclosure can form a semiconductor layer containing desired air voids during uninterrupted growth of a group III-V material (e.g., GaN). The semiconductor layer with embedded air voids can enable fabrication of freestanding GaN substrates and other group-III nitride semiconductor substrates for bulk-production of semiconductor materials. For example, the semiconductor layer of the air voids can enable easy removal of the substrate from the group III nitride semiconductor layer by spontaneous peeling or using a chemical solution or mechanical impact. Moreover, the embedded air voids may enhance the light extraction efficiency of light-emitting diodes fabricated on the substrate.

As referred to herein, a group III material may be any material that includes an element in the boron group, such as gallium (Ga), indium (In), thallium (Tl), aluminum (Al), and boron (B). A group V material may be any material that includes an element in the nitrogen group, such as nitrogen (N), phosphorus (P), arsenic (As), etc. A group III-V material may be any material that includes a group III element and a group V element, such as aluminum nitride (AlN), gallium nitride (GaN), and indium nitride (InN).

As used herein, when an element or layer is referred to as being "on" another element or layer, the element or layer may be directly on the other element or layer, or intervening elements or layers may be present. In contrast, when an element or layer is referred to as being "directly on" another element or layer, there are no intervening elements or layers present.

Examples of embodiments of the present disclosure will be described in more detail with reference to the accompanying drawings. It should be understood that the following embodiments are given by way of illustration only to provide thorough understanding of the disclosure to those skilled in the art. Therefore, the present disclosure is not limited to the following embodiments and may be embodied in different ways. Further, it should be noted that the drawings are not to precise scale and some of the dimensions, such as width, length, thickness, and the like, can be exaggerated for clarity of description in the drawings. Like components are denoted by like reference numerals throughout the specification.

Figure 1B:
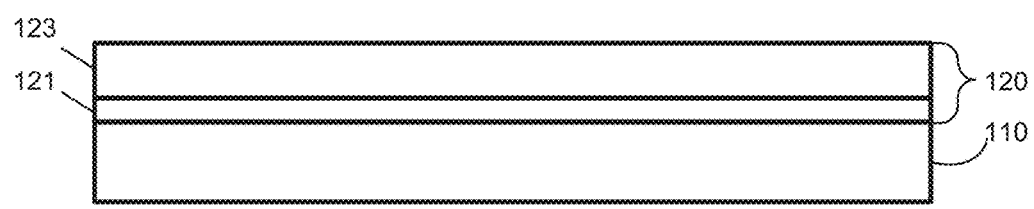
Figure 1C:
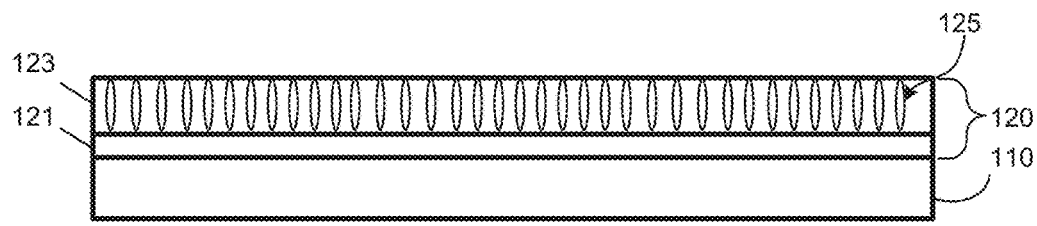

FIGS. 1A, 1B, and 1C are schematic diagrams illustrating a process for fabricating an example 100 of a semiconductor device in accordance with some embodiments of the present disclosure.

As illustrated in FIG. 1A, semiconductor device 100 may include a substrate 110, a first semiconductor layer 120, and a second semiconductor layer 130. The substrate 110 may contain any material suitable for serving as a substrate for crystalline growth, such as sapphire, gallium nitride (GaN), silicon carbide (SiC), silicon (Si), quartz, Gallium Arsenide (GaAs), Aluminum nitride (AlN), etc. The substrate may contain one or more crystalline materials having any suitable crystallographic orientation (e.g., a nonpolar orientation, a semipolar orientation, or a polar orientation).

In some embodiments, the substrate 110 can include one or more layers (not shown in FIG. 1A). For example, the substrate 100 can include a first layer comprising a sapphire substrate. In some embodiments, the substrate 110 can include a patterned sapphire substrate. As another example, substrate 110 can include a second layer comprising a group III-V material (e.g., a group III-nitride material, such as gallium nitride (GaN)). The second layer may contain one or more crystalline materials having any suitable crystallographic orientation, such as a nonpolar orientation, a semipolar orientation, etc.

Figure 4:
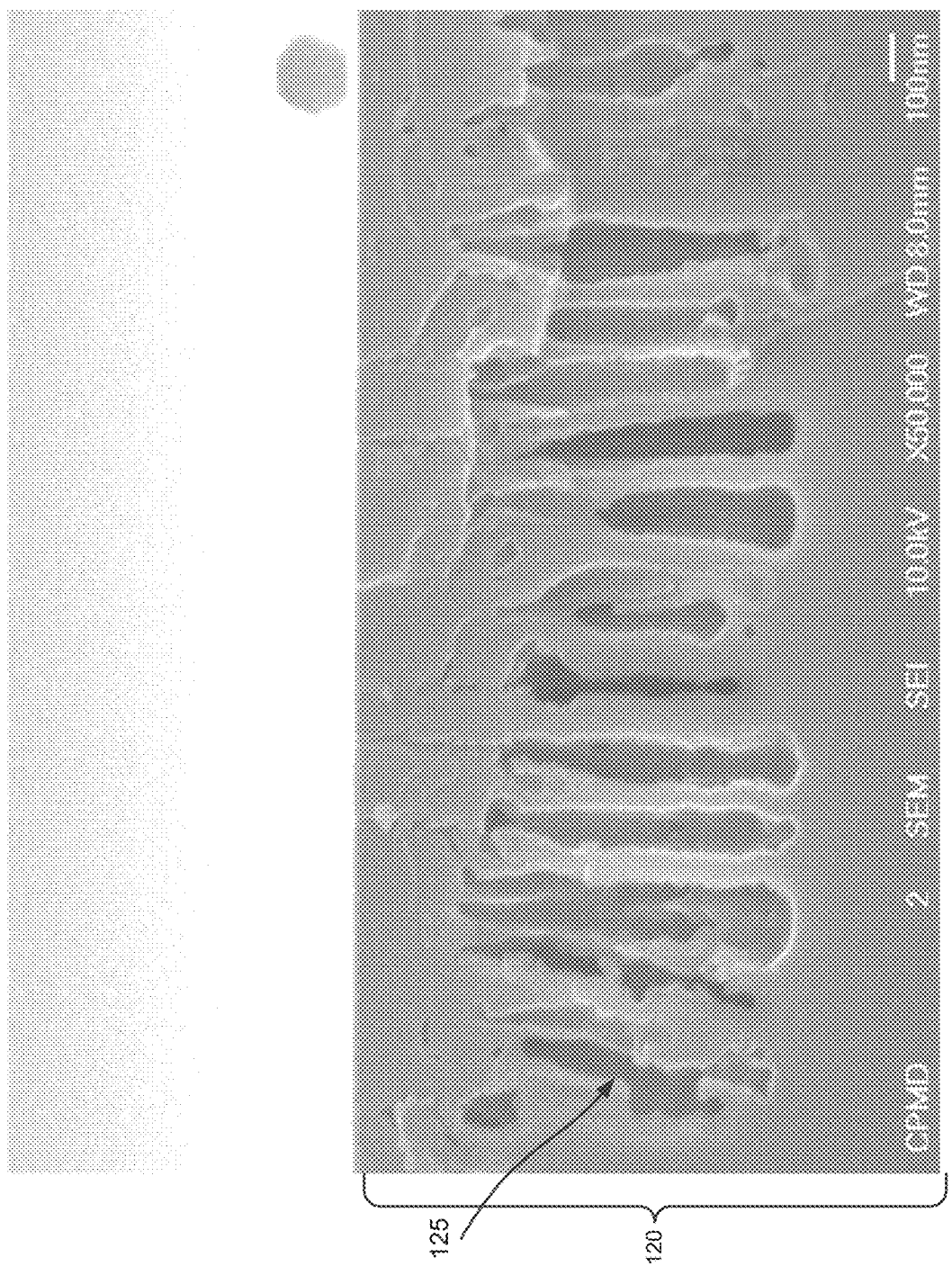
FIGS. 4, 5, and 6 illustrate examples of semiconductor layers with embedded air voids according to some embodiments of the disclosure.
Figure 5:
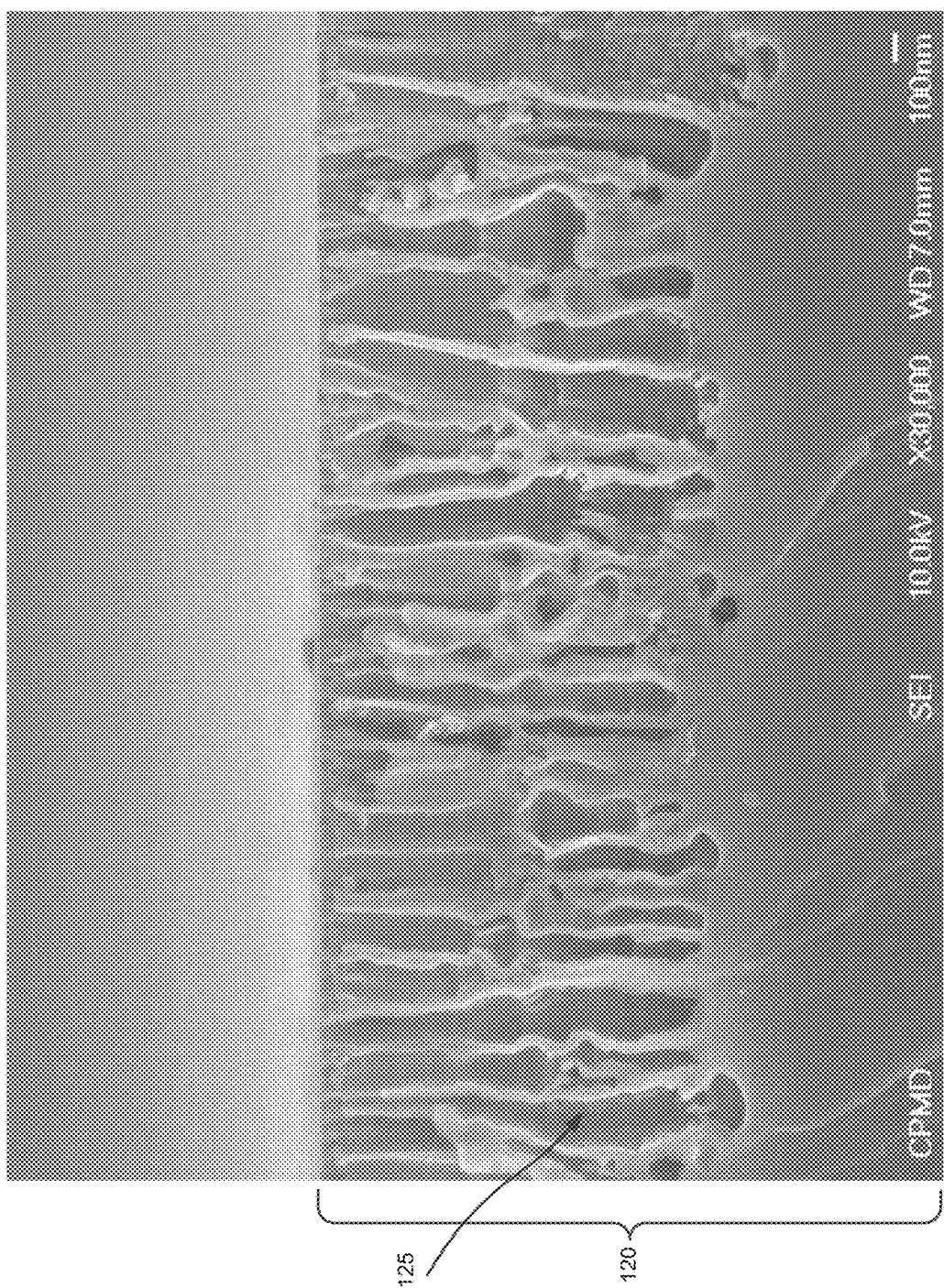
Figure 6:
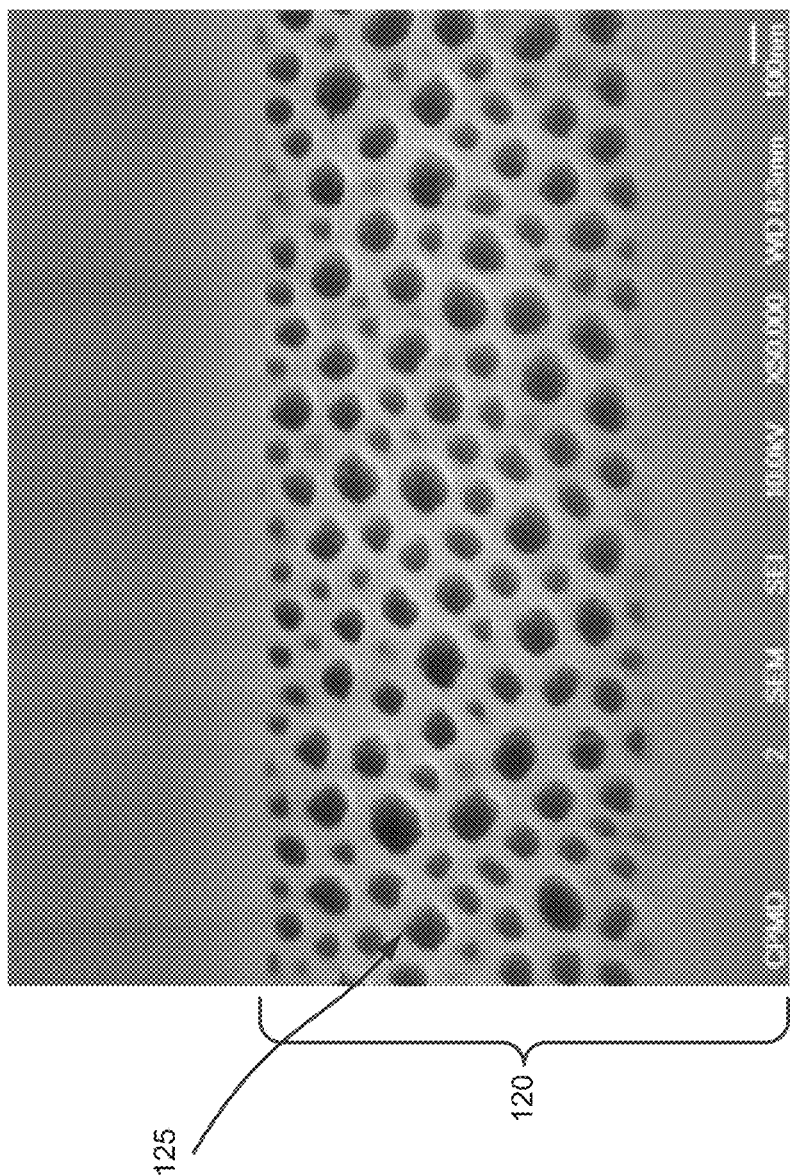

As illustrated in FIG. 1A, the first semiconductor layer 120 may be formed on substrate 110 and may include one or more air voids 125. Each of air voids 125 may have any suitable size, density, dimension, etc. In some embodiments, one or more of the air voids illustrated in FIGS. 4-6 may be formed in the first semiconductor layer 120. The first semiconductor layer 120 may be positioned between the substrate 110 and the second semiconductor layer 130. One or more intervening layers may or may not present between the first semiconductor layer 120 and the second semiconductor 130. One or more intervening layers may or may not present between the first semiconductor layer 120 and the second semiconductor 130. In one implementation, the first semiconductor layer 120 may serve as an interface between the substrate 100 and the second semiconductor layer 130. For example, a first surface of the first semiconductor layer 120 may be deposited directly on the substrate 100. The second semiconductor layer 120 may be deposited directly on a second surface of the first semiconductor layer 120. In another implementation, one or more intervening layers (not shown in FIG. 1A) may be deposited between the first semiconductor layer 120 and the second semiconductor layer 130. Alternatively or additionally, one or more intervening layers (not shown in FIG. 1A) may be deposited between the first semiconductor layer 120 and the substrate 110.

The first semiconductor layer 120 may include an undoped layer of a group III-V material (e.g., gallium nitride) that is not doped with impurities. The first semiconductor layer 120 may or may not include a doped layer of the group III-V material doped with a particular conductivity. In some embodiments, the first semiconductor layer 120 does not include a doped layer of the group III-V material.

The second semiconductor layer 130 can include one or more epitaxial layers of semiconductor materials and/or any other suitable material. For example, the second semiconductor layer 130 can include one or more layers formed from one or more group III-V materials (e.g., group III-nitride materials, such as gallium nitride). In some embodiments, one or more portions of semiconductor layer 130 may be doped to have a desired conductivity (e.g., n-type conductivity or p-type conductivity). For example, multiple crystalline layers of the semiconductor layer 130 can be doped to have different conductivities (e.g., opposing conductivities). Integrated circuit devices (e.g., transistors, diodes, thyristors, LEDs, and laser diodes) can be fabricated in the second semiconductor layer 130. Doping may be performed during the epitaxial growth of one or more portions of the second semiconductor layer 130 in one implementation. In another implementation, doping can be performed after the epitaxial growth (e.g., using ion implantation into one or more of the epitaxial layers in semiconductor layer 130). In some embodiments, the second semiconductor layer 130 can include one or more layers as described in connection with FIG. 2 below.

The second semiconductor layer 130 can be separated from the substrate 110 and/or the first semiconductor layer 120 using any suitable technique. For example, the second semiconductor layer 130 can be separated from the substrate 110 by application of physical force to the first semiconductor layer 120. As another example, the semiconductor layer 130 can be separated from the substrate 110 by chemical etching. In some embodiments, after separation of the second semiconductor layer 130 and the substrate 110, the first semiconductor layer 120 can remain on the substrate 110.

As illustrated in FIG. 1B, the first semiconductor layer 120 may be formed on the substrate 100. The first semiconductor layer 120 may include one or more layers (e.g., layers 121 and 123). Each of the layers may be formed using any suitable processes for growing crystalline layers, such as metal organic chemical vapor deposition (MOCVD) (also referred to as metalorganic vapor phase epitaxy (MOVPE)), molecular-beam epitaxy (MBE), vapor phase epitaxy (VPE), and/or any other suitable epitaxial growth process. As an example, a MOCVD process may be initiated to form an epitaxial layer of a group III nitride material (e.g., gallium nitride) by cleaning substrate 110 in a processing chamber. The cleaning process may include heating the substrate 110 to a desired temperature in a hydrogen ambient or any other suitable ambient. The desired temperature may be any temperature within a range of desired temperatures (e.g., a temperature between approximately 1100° C. and approximately 1200° C.). The MOCVD may be carried out by providing flows of suitable precursors to the processing chamber and using thermal processes to achieve deposition. An epitaxial layer 121 may be formed. For example, a GaN layer may be deposited using gallium and nitrogen containing precursors. Examples of gallium containing precursors may include trimethylgallium (TMGa), triethylgallium (TEGa), and/or any other suitable source of gallium. Examples of nitrogen containing precursors may include ammonia, phenylhydrazine, and/or any other suitable source of nitrogen. The gallium and nitrogen containing precursors may be supplied for a suitable period of time to achieve deposition of a crystalline layer of a desired thickness. In some embodiments, layer 121 may include an undoped layer of the group III nitride material (e.g., gallium nitride) that is not doped with impurities.

In some embodiments, after formation of layer 121 and/or any other desired layer, the growth temperature may be decreased to a desired value (e.g., a temperature between approximately 300° C. and approximately 800° C.). A layer 123 of a first group III material and a second group III material may be formed. For example, the first group III material and the second group III material may be gallium and indium, respectively. In some embodiments, one or more precursors containing the first group III material and the second group III material may be provided to the processing chamber to form layer 123. For example, a first precursor comprising the first group III material and a second precursor comprising the second group III material may be provided to the processing chamber. The first precursor may include, for example, TMGa, TEGa, and/or any other suitable source of gallium. The second precursor may include, for example, trimethylindium (TMIn), triethylindium (TEIn), and/or any other suitable source of indium. A third precursor containing nitrogen may also be applied to the processing chamber. The third precursor may include, for example, ammonia, phenylhydrazine, and/or any other suitable source of nitrogen. The precursor molecules pyrolyze leaving the atoms (e.g., gallium atoms and indium atoms) on a surface of layer 121. The atoms bond to the surface and a crystalline layer 123 of the first group III material and the second group III material (e.g., an InGaN layer) is grown. In some embodiments, droplets of the second group III material (e.g., indium droplets) can segregate at the interface of layer 123. The precursors containing the first group III material and the second group III material may be supplied for a suitable period of time to achieve deposition of layer 123 of a desired thickness.

As illustrated in FIG. 1C, one or more air voids 125 may be formed in the first semiconductor layer 120. For example, the air voids 125 may be formed by removing one or more portions of the second group III material (e.g., indium) deposited on the first semiconductor layer 120. In some embodiments, the supply of the second precursor may be stopped (e.g., upon achieving a desired thickness of layer 123). The temperature of the processing chamber can be increased to a desired value (e.g., a temperature over 800° C.). A gas flow may then be provided to the processing chamber to form air voids 125. The gas flow may be and/or include any suitable gas that may remove one or more portions of the second group III material from the first semiconductor layer 120 (e.g., from layer 123). In some embodiments, the gas flow may include hydrogen. The presence of hydrogen in the processing chamber may reduce indium segregation at the surface of layer 123 and may result in low or no incorporation of indium into indium gallium nitride. As such, air voids 125 may be formed when indium atoms are removed from the surface of layer 123. The gas flow may be supplied to the processing chamber for any suitable period of time to form desirable air voids in layer 120.

In some embodiments, the gas flow of hydrogen may be supplied along with one or more other gases. For example, a mixture of multiple gases, such as a mixture of hydrogen, nitrogen, and/or ammonia may be supplied to the processing chamber in some embodiments.

Each of air voids 125 may have any desired size, density, dimension, and/or any other attribute. For example, air voids of various sizes, densities, dimensions, and/or any other attribute may be formed by controlling one or more growth conditions, such as the amount of the second semiconductor material provided to the processing chamber, the amount of the hydrogen gas provided to the processing chamber, the flow rate of the hydrogen gas, etc.

More particularly, for example, the attributes of the air voids 125 (e.g., size, length) may be controlled by growing the layer 123 with a desired concentration of the second group III material (e.g., a desired indium concentration) and/or a desired thickness. A particular concentration of the second group III material in the layer 123 may be controlled by controlling one or more growth conditions during the formation of the layer 123, for example, by providing a particular amount of the second group III material to the processing chamber (e.g., a particular amount of the second precursor, a particular ratio of the first precursor to the second precursor, etc.), providing the second group III material to the processing chamber for a particular duration, etc. In one implementation, the first precursor and/or the second precursor may contain a desirable composition of the second group III material (e.g., a composition less than 5%, 35%, or any other suitable threshold, a composition within a range of desired compositions of the second group III material, etc.). In some embodiments, a particular thickness of the layer 123 may be deposited by flowing the first precursor and/or the second precursor at a given flow rate for a given duration.

In some embodiments, after air voids 125 are formed, the temperature of the processing chamber may be controlled to a desired value (e.g., a temperature above 900° C., such as 1150° C.). Growth of the group III-V material (e.g., gallium nitride) may continue. For example, the semiconductor layer 130 of gallium nitride may be formed. One or more intervening layers may or may not present between the first semiconductor layer 120 and the second semiconductor 130. In one implementation, the second semiconductor layer 120 may be formed directly on a surface of the first semiconductor layer 120. In another implementation, one or more intervening layers may be deposited between the first semiconductor layer 120 and the second semiconductor layer 130.

Figure 2:
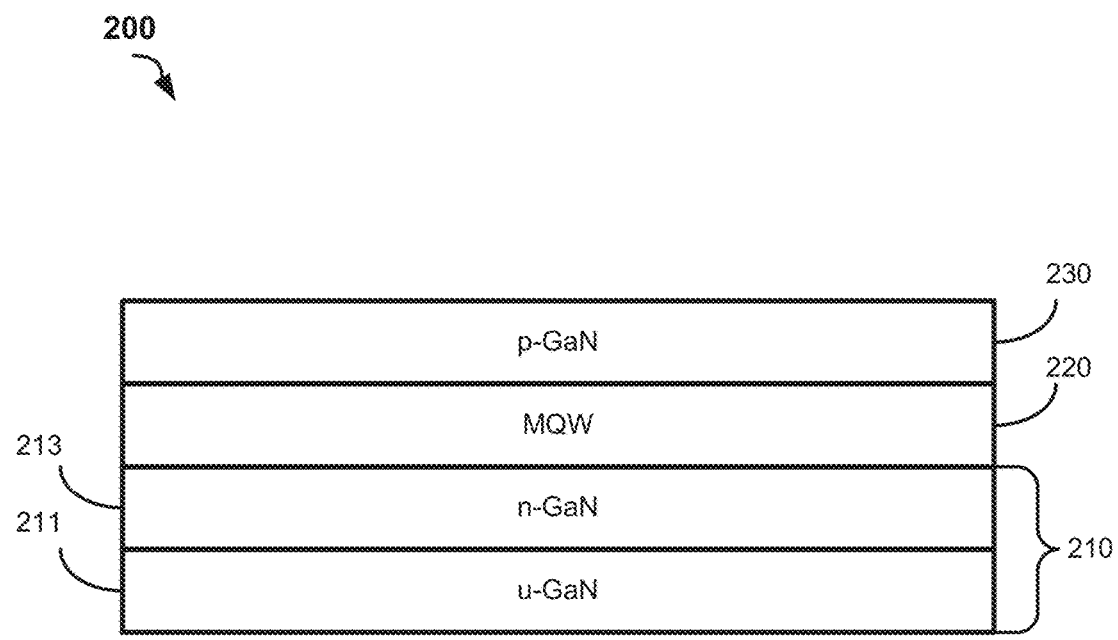
FIG. 2 is a schematic diagram of an example of a semiconductor layer according to some embodiments of the disclosure.

FIG. 2 is a schematic diagram illustrating an example 200 of a semiconductor layer in accordance with some embodiments of the present disclosure. In some embodiments, semiconductor layer 200 may be the same as the second semiconductor layer 130 as described in connection with FIGS. 1A-1C. In some embodiments, the second semiconductor layer 130 of FIGS. 1A-1C may include one or more layers of semiconductor layer 200.

As illustrated in FIG. 2, the semiconductor layer 200 can include a first crystalline layer 210, an active layer 220, a second crystalline layer 230, and/or any other suitable component. The first crystalline layer 210 may include one or more layers. For example, the first crystalline layer 210 can include an undoped layer 211 that is not doped with impurities, a doped layer 213 that is doped with a particular impurity, etc. The undoped layer 211 and/or the doped layer 213 may be formed by a suitable epitaxial growth process, such as an MOCVD process, an HVPE process, an MBE process, etc. The first crystalline layer 210 may or may not include an undoped layer. In some embodiments, the first crystalline layer 210 may be formed from III-nitride based compound semiconductor doped with a first conductive type impurity. The first conductivity impurity may be an n-type impurity in some embodiments.

The active layer 220 may be formed on the first crystalline layer 210. The active layer 220 can include a single quantum well structure or a multi-quantum well structure in which well layers (not shown in FIG. 2) and barrier layers (not shown in FIG. 2) are alternately stacked on one another.

The second crystalline layer 230 may be deposited on the active layer 220. The second crystalline layer 230 can be formed from a group III-nitride based compound semiconductor, such as an (Al, Ga, In)N-based nitride semiconductor. In some embodiments, the second crystalline layer 230 may be a GaN layer. The second crystalline layer 230 can be doped with a second conductive type impurity that is different from the first conductive type impurity. For example, the second conductive type impurity may be a p-type impurity. In some embodiments, the second crystalline layer 220 may be doped by adding suitable dopants (e.g., silicon, magnesium, etc.) and/or dopant gases (e.g., silane, disilane, etc.) during the deposition process of the second crystalline layer 220.

Figure 3:
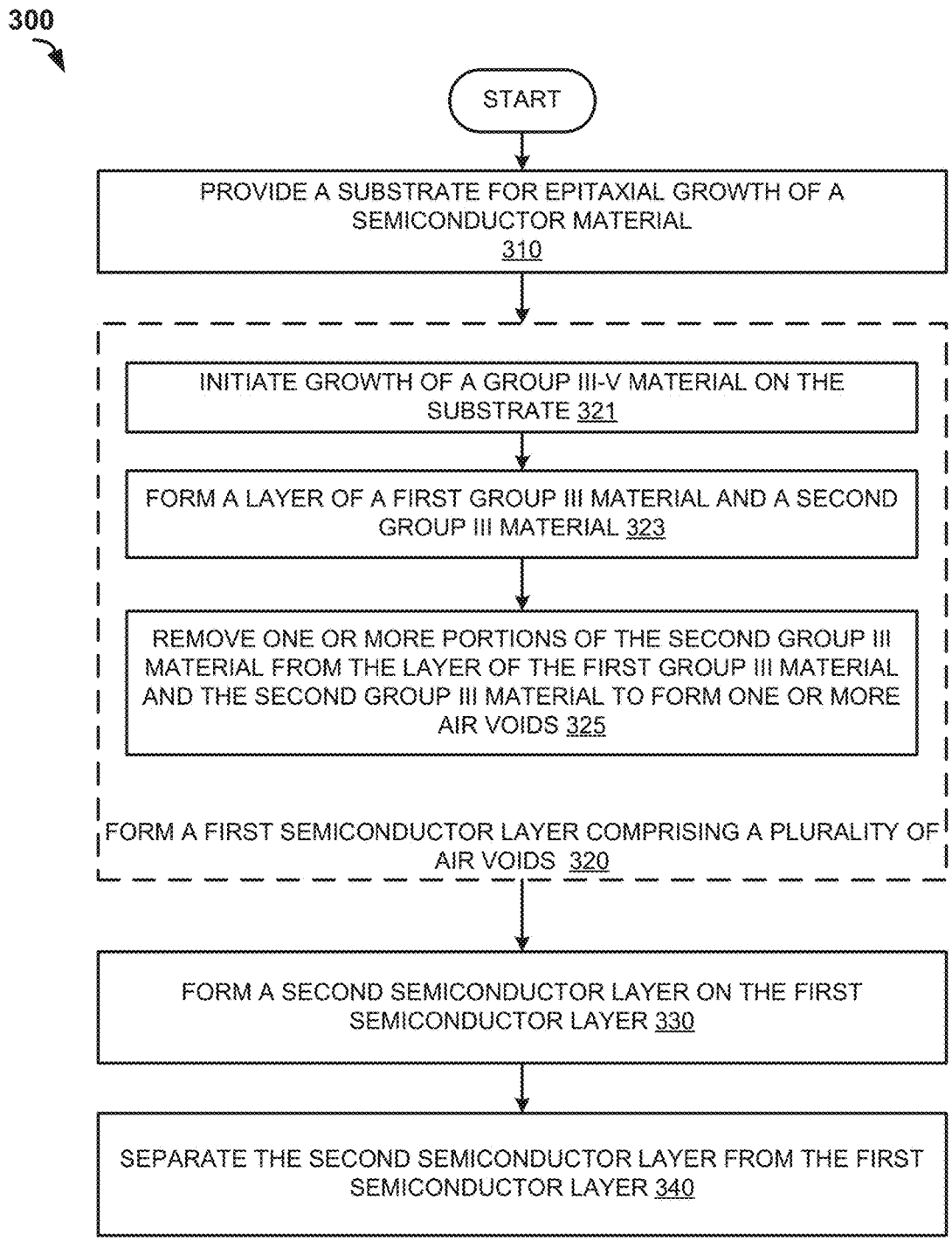
FIG. 3 is a flow diagram illustrating a method for forming air void structures according to some embodiments of the disclosure.

FIG. 3 is a flow diagram illustrating an example 300 of a method of air void formation for semiconductor fabrication according to an implementation of the disclosure.

Method 300 may begin at block 310 where a substrate is provided for epitaxial growth of a semiconductor material, such as a group III-V material. The group III-V material may be, for example, gallium nitride. The substrate may be and/or include the substrate 110 of FIGS. 1A-1C.

At block 320, a first semiconductor layer may be formed on the substrate. The first semiconductor layer may include one or more embedded air voids. For example, the first semiconductor layer may be formed by growing a layer of a first group III material and a second group III material and implementing a subtractive process to remove one or more portions of the second group III material from the layer. In some embodiments, the first group III material and the second group III material may be gallium and indium, respectively.

In some embodiments, the first semiconductor layer may be formed by performing one or more operations in blocks 321-325. At 321, growth of a group III-V material (e.g., gallium nitride) can be initiated. The group III-V material may include the first group III material in some embodiments. To initiate the growth of the group III-V material, a temperature in a processing chamber (e.g., a MOCVD reactor) may be adjusted to a first value that is suitable for the growth of the group III-V material. For example, the temperature in the processing chamber may be greater than 900° C. In some embodiments, the temperature in the processing chamber may be between approximately 900° C. and approximately 1100° C.

As another example, suitable precursors may be provided to the processing chamber to grow the III-V material. The precursors may contain a group III material, a group V material, etc. For example, precursors containing gallium and nitride may be provided to grow gallium nitride.

At 323, a layer of a first group III material and a second group III material can be formed. The first group III material may be, for example, gallium. The second group III material may be, for example, indium. In some embodiments, the temperature in the processing chamber may be adjusted to a first temperature to form the layer of the first group III material and the second group III material. The first temperature may be lower than the first value. In some embodiments, the first temperature may be a temperature within a range between 300° C. and 800° C. Precursors containing the first group III material and the second group III material can be provided to the processing chamber. The precursors may include, for example, a first precursor comprising the first group III material and a second precursor comprising the second group III material. A precursor containing the second group III material may be provided to the processing chamber. In some embodiments, the second precursor may contain the first group III material and the second group III material. The second precursor may include indium gallium nitride in some embodiments. The precursors may contain a certain composition of the second group III material (e.g., a desirable indium composition). For example, the composition of the second group III material in the precursors may be a value less than a threshold, a value within a range of desirable compositions, etc.

At 325, one or more air voids can be formed by removing one or more portions of the second group III material from the layer of the first group III material and the second group III material. For example, the flow of the second precursor may be stopped. A gas flow may be supplied to the processing chamber to form the air voids. The gas flow may include a hydrogen gas flow. In some embodiments, the gas flow may include a mixture of hydrogen, nitrogen, and/or ammonia. The presence of the gas flow may remove one or more portions of the second group III material (e.g., indium) from the first semiconductor layer. For example, droplets of the second group III material (e.g., indium droplets) may be removed by the gas flow. The presence of the gas flow may also retard incorporation of the second group III material into the first semiconductor layer. For example, the presence of hydrogen gas in the processing chamber may result in no or low incorporation of indium into indium gallium nitride. In some embodiments, the temperature in the processing chamber may be adjusted to a second temperature when the gas flow is provided to the processing chamber. The second temperature may be higher than the first temperature. The second temperature may be higher than 800° C. in some embodiments.

At 330, a second semiconductor layer may be formed on the first semiconductor layer. The second semiconductor layer may include one or more epitaxial layers of the III-V material. In some embodiments, one or more portions of the second semiconductor layer may be doped to have desired conductivity (e.g., n-type conductivity or p-type conductivity). In some embodiments, the second semiconductor layer can include one or more layers as described in connection with FIG. 2 above.

At 340, the second semiconductor layer may be separated from the substrate via the first semiconductor layer. The separation may be achieved using any suitable technique or a combination of techniques. For example, the second semiconductor layer can be separated from the substrate by application of physical force to the first semiconductor layer. As another example, the second semiconductor layer can be separated from the substrate by chemical etching.

For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term "article of manufacture," as used herein, is intended to encompass a computer program accessible from any computer-readable device or memory page media.

The terms "approximately" and "about" may be used to mean within ±20% of a target dimension in some embodiments, within ±10% of a target dimension in some embodiments, within ±5% of a target dimension in some embodiments, and yet within ±2% in some embodiments. The terms "approximately" and "about" may include the target dimension.

In the foregoing description, numerous details are set forth. It will be apparent, however, that the disclosure may be practiced without these specific details. In some instances, well-known structures and devices are shown in block diagram form, rather than in detail, in order to avoid obscuring the disclosure.

The terms "first," "second," "third," "fourth," etc. as used herein are meant as labels to distinguish among different elements and may not necessarily have an ordinal meaning according to their numerical designation.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Reference throughout this specification to "an implementation" or "one implementation" means that a particular feature, structure, or characteristic described in connection with the implementation is included in at least one implementation. Thus, the appearances of the phrase "an implementation" or "one implementation" in various places throughout this specification are not necessarily all referring to the same implementation.

Whereas many alterations and modifications of the disclosure will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as the disclosure.

What is claimed is:

1. A method, comprising:
    forming a first semiconductor layer comprising a first group III material and a second group III material on a substrate, wherein the second group III material comprises indium;
    forming a plurality of air voids in the first semiconductor layer, comprising:
        flowing a gas flow comprising hydrogen gas to remove at least a portion of the second group III material from the first semiconductor layer, comprising:
            flowing the gas flow to remove idium droplets from a surface of the first semiconductor layer; and
    forming a second semiconductor layer on the first semiconductor layer, wherein the second semiconductor layer comprises an epitaxial layer of a group III-V material.

2. The method of claim 1, wherein the first group III material comprises gallium.

3. The method of claim 1, wherein forming the first semiconductor layer comprises initiating a process for epitaxial growth of the group III-V material.

4. The method of claim 3, wherein the process for epitaxial growth of the group III-V material comprises at least one of a metal organic chemical vapor deposition (MOCVD) process or a molecular beam epitaxy (MBE) process.

5. The method of claim 1, wherein forming the first semiconductor layer further comprises adjusting a temperature in a processing chamber to a first temperature, and wherein forming the plurality of air voids in the first semiconductor layer comprises adjusting the temperature in the processing chamber to a second temperature.

6. The method of claim 5, wherein the second temperature is higher than the first temperature.

7. The method of claim 6, wherein the first temperature is between 300° C. and 800° C.

8. The method of claim 6, wherein the second temperature is higher than 800° C.

9. The method of claim 1, wherein forming the first semiconductor layer comprises:
    flowing a first precursor comprising the first group III material in a processing chamber; and
    flowing a second precursor comprising the second group III material in the processing chamber.

10. The method of claim 9, wherein the first precursor comprises at least one of triethylgallium (TEGa) or trimethylgallium (TMGa).

11. The method of claim 9, wherein the second precursor comprises trimethylindium (TMIn).

12. The method of claim 9, wherein forming the plurality of air voids in the first semiconductor layer further comprises:
    stopping flowing the second precursor in the processing chamber.

13. The method of claim 1, wherein the gas flow further comprises ammonia.

14. The method of claim 1, wherein forming the second semiconductor layer further comprises growing an epitaxial layer of the group III-V material on the first semiconductor layer.

15. The method of claim 1, wherein the group III-V material comprises the first group III material.

16. The method of claim 15, wherein the III-V material comprises gallium nitride.

17. The method of claim 1, wherein forming the first semiconductor layer comprises forming an InGaN layer.

18. The method of claim 1, wherein forming the first semiconductor layer comprises forming a layer of the group III-V material.

19. The method of claim 1, further comprising separating the second semiconductor layer from the substrate via the first semiconductor layer.

* * * * *